(12) United States Patent
Lee

(10) Patent No.: US 9,356,565 B2
(45) Date of Patent: May 31, 2016

(54) BUFFER AMPLIFIER CIRCUIT

(71) Applicant: Hae-Seung Lee, Lexington, MA (US)

(72) Inventor: Hae-Seung Lee, Lexington, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 0 days.

(21) Appl. No.: 14/723,044

(22) Filed: May 27, 2015

(65) Prior Publication Data

US 2015/0280658 A1    Oct. 1, 2015

Related U.S. Application Data

(63) Continuation of application No. 14/210,958, filed on Mar. 14, 2014, now Pat. No. 9,154,089.

(60) Provisional application No. 61/791,911, filed on Mar. 15, 2013.

(51) Int. Cl.
| | | |
|---|---|---|
| *H03F 3/16* | (2006.01) | |
| *G11C 27/02* | (2006.01) | |
| *H03H 19/00* | (2006.01) | |
| *H03F 3/00* | (2006.01) | |
| *H03M 1/12* | (2006.01) | |

(52) U.S. Cl.
CPC .............. *H03F 3/16* (2013.01); *G11C 27/024* (2013.01); *H03F 3/005* (2013.01); *H03H 19/004* (2013.01); *H03M 1/1245* (2013.01)

(58) Field of Classification Search
CPC .............. H03H 19/004; G11C 27/02; G11C 27/024–27/27026; H03M 1/124; H03M 1/1245
See application file for complete search history.

(56) References Cited

U.S. PATENT DOCUMENTS

| | | | |
|---|---|---|---|
| 4,763,106 A | 8/1988 | Gulczynski | |
| 4,907,002 A | 3/1990 | Kawada | |
| 5,311,085 A | 5/1994 | Pelgrom et al. | |
| 5,475,337 A * | 12/1995 | Tatsumi | H03F 3/005 327/554 |
| 5,506,525 A | 4/1996 | Debroux | |
| 5,574,457 A * | 11/1996 | Garrity | H03H 19/004 341/155 |
| 5,654,666 A | 8/1997 | Taga et al. | |
| 5,698,999 A * | 12/1997 | Etoh | G11C 27/026 327/94 |
| 6,438,366 B1 * | 8/2002 | Lindfors | H03H 19/004 330/258 |
| 6,452,531 B1 | 9/2002 | Miller et al. | |
| 7,030,804 B2 * | 4/2006 | Yoshioka | G11C 27/024 341/155 |
| 7,692,471 B2 | 4/2010 | Uno | |
| 8,823,572 B2 | 9/2014 | Lemkin | |
| 2005/0073351 A1 | 4/2005 | Ko et al. | |

FOREIGN PATENT DOCUMENTS

WO    WO2014059437    4/2014

OTHER PUBLICATIONS

U.S. ISA, "International Search Report—App. No. PCT/US14/27303", Sep. 9, 2014, WIPO.

* cited by examiner

*Primary Examiner* — Howard Williams
(74) *Attorney, Agent, or Firm* — Intrinsic Law Corp.; Ibrahim M. Hallaj

(57) ABSTRACT

Amplifier circuits implemented with a buffer amplifier with a voltage gain substantially equal to one. In one example, a continuous-time amplifier is implemented by applying the input source across the input and the output terminals of the buffer amplifier. In another example, a discrete-time amplifier is implemented. During the sampling phase at least one input voltage is sampled, and during the transfer phase at least one capacitor is coupled across the input and the output terminals of a buffer amplifier to effectuate an amplification.

13 Claims, 26 Drawing Sheets

BUFFER AMPLIFIER CIRCUIT

RELATED APPLICATIONS

This application is a continuation of and claims the benefit and priority of U.S. Non-Provisional application Ser. No. 14/210,958 entitled "Buffer Amplifier Circuit," filed on Mar. 14, 2014, which claims the benefit and priority of U.S. Provisional Application No. 61/791,911 entitled, "Buffer-Based Signal Amplification," filed on Mar. 15, 2013, both of which are hereby incorporated by reference.

TECHNICAL FIELD

This application is directed to microelectronic circuits and circuit design and operation. More particularly, this application is directed to microelectronic amplifier circuits for use in semiconductor devices, integrated circuits and other electronic devices.

BACKGROUND

Signal amplification is widely used in a variety of electronic systems. For example, in wireless communication systems, a low-noise amplifier (LNA) in the receiver amplifies the tiny signal picked up by an antenna. The amplified signal is then filtered, demodulated and further amplified again. The signal is often converted to a digital signal by an analog-to-digital converter. The analog-to-digital converter also typically amplifies the signal in the conversion process. In the transmitter, the power amplifier amplifies the radio frequency signal before the signal is transmitted through the antenna. In systems employing sensors, such as image sensors, microphones, and micro-electromechanical sensors, the signal produced by the sensors is very small, and thus must be amplified before further signal processing. There are numerous other places where signal amplification is required in a system. Conventional amplifier circuits fall into three general categories: a common-emitter amplifier (a common-source amplifier in MOS technologies), a common-based (a common-gate amplifier in MOS technologies), and an emitter-follower amplifier (a source-follower amplifier in MOS technologies). The first two types typically provide a substantial amount of voltage gain. However, the last type provides voltage gain that is close to one or slightly less, and as a result it has been suitable only as a buffer amplifier, but not as a voltage amplifier.

As an example of a simple circuit according to the prior art, FIG. 1 provides an illustration of a representative common-source amplifier circuit 20 which operate in continuous-time. The circuit 20 also includes a MOSFET $M_1$, and a load resistor $R_L$. An analog input voltage $v_{IN}$ (hereafter referred to as "input voltage") provides an input to the circuit 20, and a voltage $v_O$ (hereafter referred to as "output voltage") is provided as an output of the circuit 20. The input voltage $V_{IN}$ generally includes a DC bias component $V_{IN}$ and a small-signal component $v_{in}$ (hereafter referred to as "input signal") such that $v_{IN}=V_{IN}+v_{in}$. Likewise, the output voltage $v_O$ generally includes a DC component $V_O$ and a small-signal component $v_o$ (hereafter referred to as "output signal") such that $v_O=V_O+v_o$. The DC components are required to bias the MOSFET in the desired region of operation. The small-signal components are typically the signals of interest. The circuit 20 amplifies the input signal vi such that the output signal $v_o$ is given by $$v_o = -g_m R_L v_{in}$$

where $g_m$ is the transconductance of M1. The small-signal voltage gain (hereafter referred to as "voltage gain"), defined as the ratio between the output signal $v_o$ and the input signal $v_i$ is then $$a_v = \frac{v_o}{v_{in}} = -g_m R_L.$$

Further analysis of the circuit 20 shows that the frequency $f_h$ where the magnitude of the voltage gain drops by 3 dB's from the low frequency value (hereafter referred to as "bandwidth") is given by $$f_h = \frac{1}{2\pi R_L C_L}$$

where $C_L$ is the total capacitance at the output node. A figure-of-merit, the gain-bandwidth product GBW, of an amplifier is defined as the product between the low-frequency gain and the bandwidth. For the circuit 20, it is given by $$GBW = |a_v f_h| = \frac{g_m}{2\pi C_L}.$$

SUMMARY

Applicants have recognized that substantial voltage amplification can be achieved with a buffer amplifier whose voltage gain is substantially equal to one, with the application including but not limited to signal amplification, voltage comparators, and A/D converters. In view of the foregoing, various preferred embodiments disclosed herein generally relate to an amplifier circuits having one or more buffer amplifiers and one or more resistors or one or more capacitors. Those skilled in the art will appreciate that the present concepts can be extended to other applications and circuits than the ones presented herein for the purpose of illustration. These and equivalent and similar circuits and techniques are intended to be covered by the scope of the appended claims.

An embodiment is directed to an amplifier circuit operable in continuous-time. The amplifier circuit comprises: a buffer amplifier having an input terminal and an output terminal and an input source having a source resistance. The buffer amplifier has high input resistance and a voltage gain substantially equal to one, and the input source is electrically coupled across the input terminal and the output terminal of the buffer amplifier.

Another embodiment is directed to an amplifier circuit operable in continuous-time with a voltage gain determined by a resistor ratio. The amplifier circuit comprises: a buffer amplifier having an input terminal and an output terminal, at least one resistor coupled to the input terminal of the buffer amplifier, and an input source having a source resistance. The buffer amplifier has high input resistance and a voltage gain substantially equal to one, and the input source is electrically coupled across the input terminal and the output terminal of the buffer amplifier.

And another embodiment is directed to a discrete-time amplifier circuit operable in a sampling phase and an amplification phase to amplify a weighted sum of two input voltages. The amplifier circuit comprises a plurality of switches, a first and a second capacitor, and at least one buffer amplifier having an input terminal and an output terminal. During the sampling phase, the plurality of switches are configured to couple a first input voltage to the first capacitor and a second input voltage to the second capacitor. During the amplification phase, the plurality of switches are configured to couple the first and the second capacitors across the input terminal and the output terminal of the buffer amplifier to amplify a weighted sum of the first and the second input voltages.

Yet another embodiment is directed to a discrete-time amplifier circuit operable in a sampling phase and an amplification phase to amplify a weighted sum of two input voltages without the adverse effect of an offset voltage of a buffer amplifier. The amplifier circuit comprises a plurality of switches, a first and a second capacitor, and at least one buffer amplifier having an input terminal and an output terminal. During the sampling phase, the plurality of switches are configured to couple a first input voltage and the output terminal of the buffer amplifier to the first capacitor and a second input voltage and the output terminal of the buffer amplifier to the second capacitor. During the amplification phase, the plurality of switches are configured to couple the first and the second capacitors across the input terminal and the output terminal of the buffer amplifier to amplify a weighted sum of the first and the second input voltages without the adverse effect of an offset voltage of the buffer amplifier.

Still another embodiment is directed to a discrete-time amplifier circuit operable in a sampling phase and an amplification phase to amplify a difference between an input voltage and an intentional offset voltage of a buffer amplifier. The amplifier circuit comprises a plurality of switches, at least one capacitor, and a buffer amplifier having an input terminal and an output terminal. The buffer amplifier includes an intentional offset voltage, and the second capacitor is electrically coupled to the input terminal of the first buffer amplifier. During the sampling phase, the plurality of switches are configured to couple an input voltage to the first capacitor. During the amplification phase, the plurality of switches are configured to couple the at least one capacitor across the input terminal and the output terminal of the buffer amplifier to amplify a difference between the first input voltage and the first intentional offset voltage.

An embodiment is directed to a discrete-time amplifier circuit operable in a sampling phase and an amplification phase to amplify a difference between an input voltage and intentional offset voltages of a plurality of buffer amplifiers. The amplifier circuit comprises a plurality of switches, a first, a second, and a third capacitor, and a first and a second buffer amplifier. The first buffer amplifier includes a first intentional offset voltage and the second buffer amplifier includes a second intentional offset voltage. The third capacitor is electrically coupled to the input terminal of the first buffer amplifier. During the sampling phase, the plurality of switches are configured to couple a first input voltage to the first and the second capacitor. During the amplification phase, the plurality of switches are configured to couple the first capacitor across the input terminal and the output terminal of the first buffer amplifier and the second capacitor across the input terminal and the output terminal of the first buffer amplifier.

Another embodiment is directed to a flash analog-to-digital converter employing a buffer-based discrete-time amplifier circuit operable in a sampling phase and an amplification phase as a preamplifier for a voltage comparator. The analog-to-digital converter circuit comprises a plurality of switches, at least one capacitor, at least one buffer amplifier having an input terminal and an output terminal, and a latch circuit coupled to the input terminal of the buffer amplifier. During the sampling phase, the plurality of switches are configured to couple an input voltage to the at least one capacitor. During the amplification phase, the plurality of switches are configured to couple the at least one capacitor across the input terminal and the output terminal of the buffer amplifier.

Yet another embodiment is directed to a successive approximation register analog-to-digital converter employing a buffer-based discrete-time amplifier circuit operable in a sampling phase and an amplification phase as a preamplifier for a voltage comparator. The analog-to-digital converter circuit comprises a plurality of switches, at least one capacitor, a first and a second buffer amplifier having an input terminal and an output terminal, and a latch circuit coupled to the input terminal of the first buffer amplifier. An output of the latch circuit is coupled to the plurality of switches. During the sampling phase, the plurality of switches are configured to couple an input voltage to the at least one capacitor. During the amplification phase, the plurality of switches are configured to couple the at least one capacitor across the input terminal and the output terminal of the first buffer amplifier or the second buffer amplifier depending on the digital output of the latch circuit.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

IN THE DRAWINGS

The appended drawings are provided to aid the understanding of the inventions and the following description of certain embodiments, and are to be considered as illustrative rather than limiting the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1 provides an illustration of a prior art MOS common-source amplifier according to the prior art.

DETAILED DESCRIPTION

The following description provides a discussion of various concepts related to, and embodiments of the present inventive apparatus and methods relating to signal amplification circuits. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Some aspects of the present invention provide a continuous-time amplifier topology based on a buffer amplifier (hereafter referred to as "buffer"). A buffer is an amplifier that provides a voltage gain substantially close to one as would be understood by those skilled in the art, while providing high input resistance and low output resistance. Those skilled in the art would also understand that a source-follower circuit or an emitter-follower circuit can be examples of a buffer.

Figure 1:
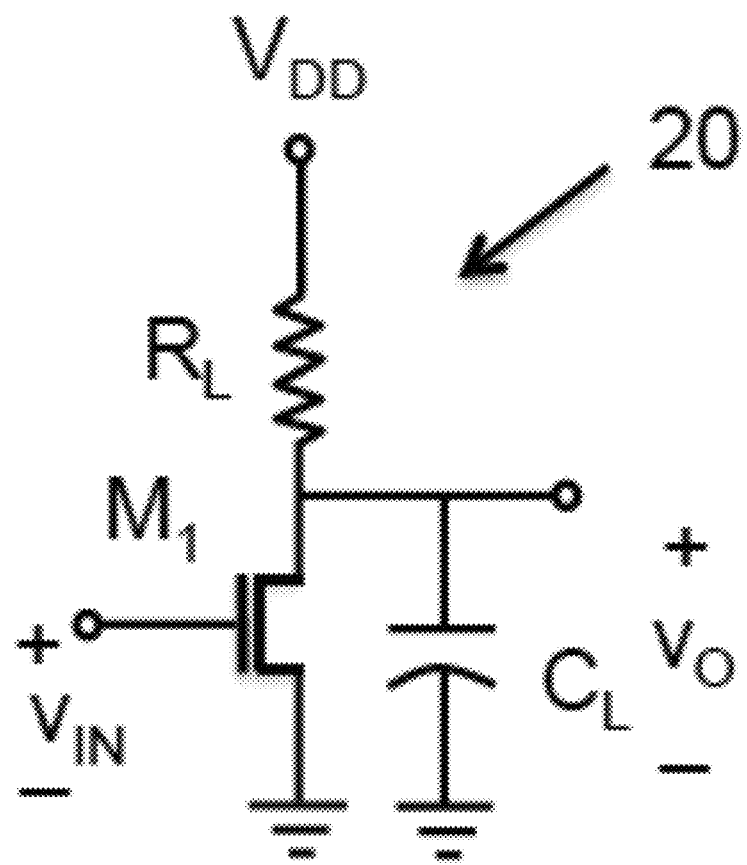
Figure 2:
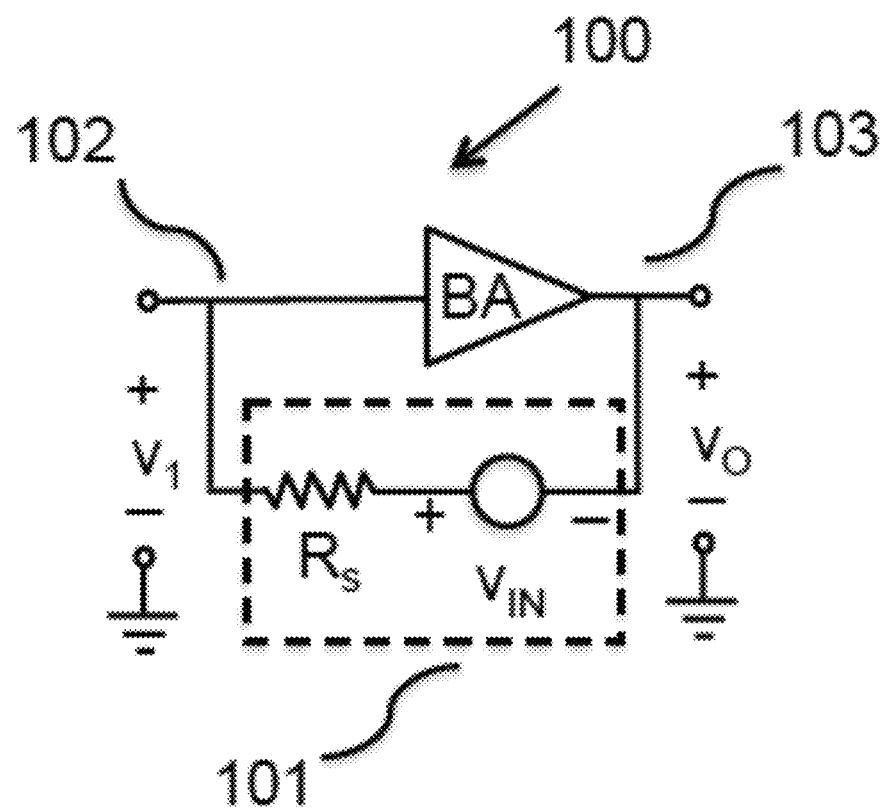
FIG. 2 illustrates an amplifier circuit including a buffer amplifier, according to a first embodiment of the present invention.

A first embodiment of the present invention is shown in FIG. 2. The amplifier circuit 100 comprises a buffer amplifier BA, which may be a simple follower circuit such as an emitter follower or a source follower. A more sophisticated buffer such as an operational amplifier based buffer can also be employed for higher precision. The input source 101 is represented as a Thevenin equivalent circuit with an input voltage source $v_{IN}$ and the source resistance $R_S$. The input source 101 is applied across the input terminal 102 and the output terminal 103 of BA.

Figure 3:
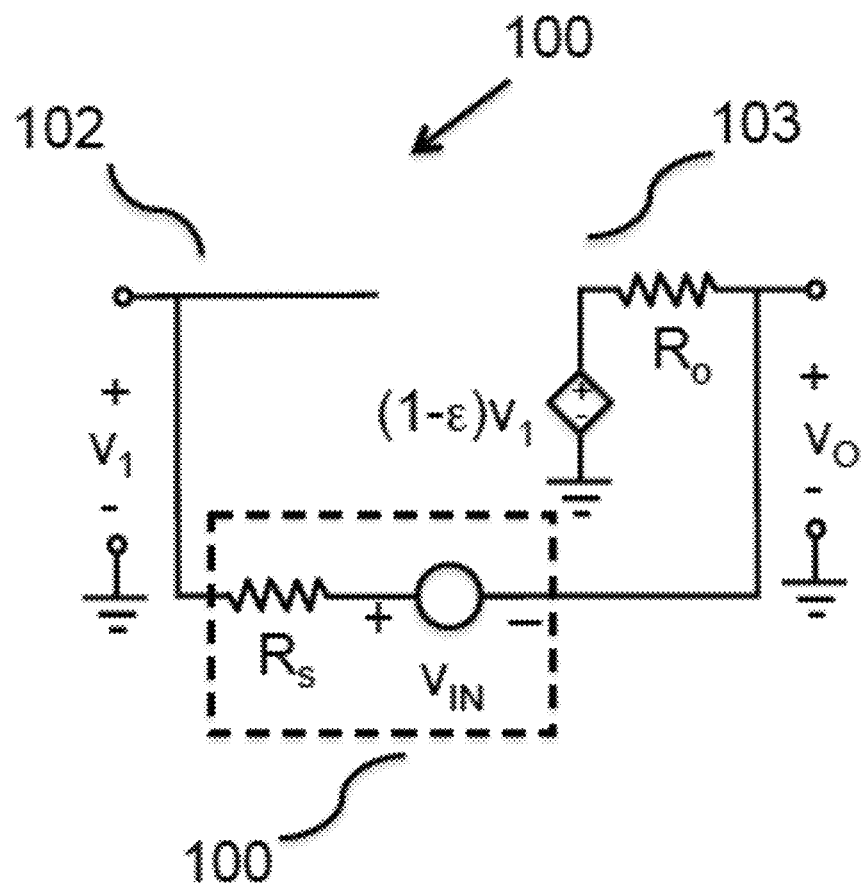
FIG. 3 illustrates the equivalent circuit of FIG. 2.

The equivalent circuit of the amplifier circuit 100 according to the first embodiment is shown in FIG. 3. The buffer amplifier is modeled as a voltage controlled-voltage source with a voltage gain $(1-\epsilon)$ where $\epsilon$ is typically much less than unity $(\ll 1)$, and an output resistance $R_o$. Since the input resistance of BA is high, it is modeled as an open-circuit in FIG. 3. Therefore, the current $i_I$ into the amplifier is zero. Hence, the current through the output resistance $R_o$ and the source resistance $R_s$ is also zero, giving;

$$v_o = (1-\epsilon)v_1$$

and $$v_1 - v_o = v_{IN}$$

Combining the above two equations, the output voltage $v_O$ of the amplifier 100 is found to be $$v_O = \frac{1-\varepsilon}{\varepsilon} v_{IN} \approx \frac{1}{\varepsilon} v_{IN}$$

Thus voltage gain of the amplifier 100 is given by;

$$a_v = \frac{v_O}{v_{IN}} = \frac{1-\varepsilon}{\varepsilon} \approx \frac{1}{\varepsilon}$$

In a typical buffer, $\epsilon$ is small, thus the voltage gain $a_v$ is large.

The output resistance of the amplifier 100 according to the first embodiment is shown to be $$R_{out} = \frac{1-\varepsilon}{\varepsilon} R_o \approx \frac{1}{\varepsilon} R_o$$

For certain applications, it may be more convenient to use the input voltage of BA $v_1$ as the output voltage. In this case, the voltage gain is given by $$a_v = \frac{v_1}{v_{IN}} = \frac{1}{\varepsilon}$$

Further analysis of the amplifier 100 shows that the bandwidth is given by $$f_h = \frac{1}{2\pi R_{out} C_L} = \frac{\varepsilon}{2\pi R_o C_L}$$

and its GBW $$GBW = |a_v f_h| = \frac{g_m}{2\pi C_L}$$

which is identical to that of the prior art amplifier 20. Thus, the first embodiment of the present invention provides an new amplifier configuration with the same figure of merit as a prior art amplifier 20.

Figure 4:
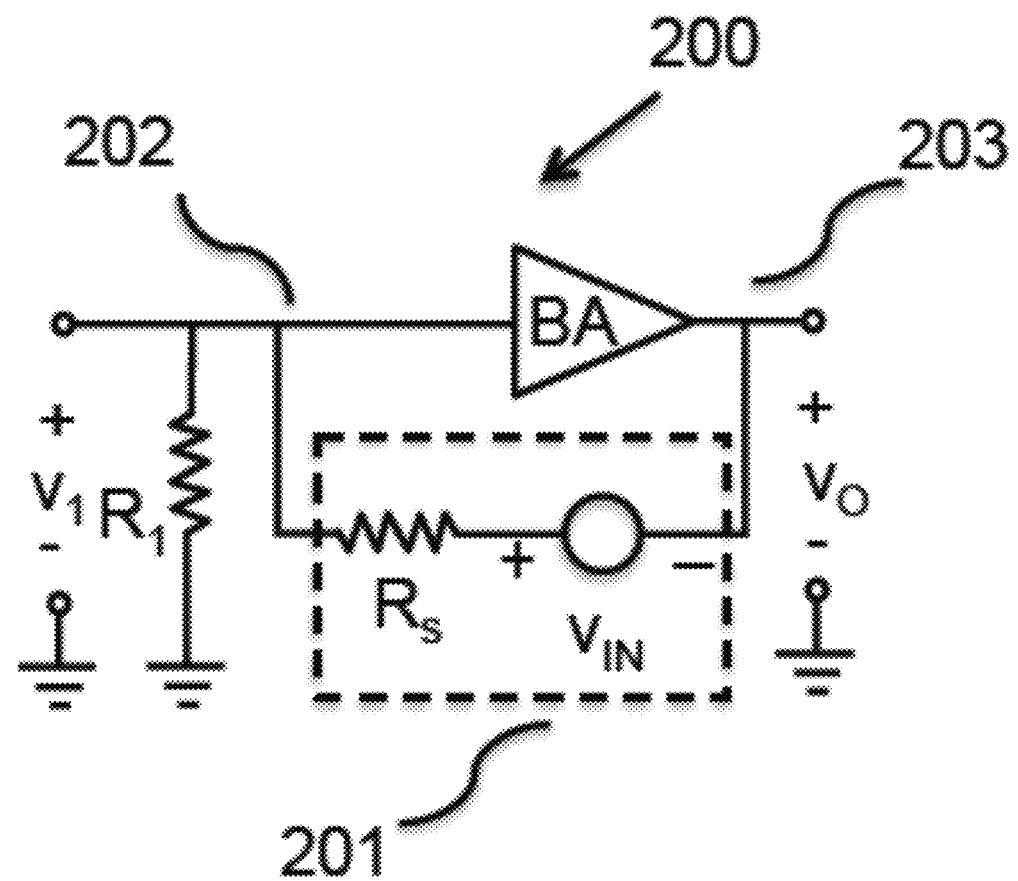
FIG. 4 illustrates an amplifier circuit including a buffer amplifier and a resistor, according to a second embodiment of the present invention.

A second embodiment of the present invention shown in FIG. 4 in which the amplifier circuit 200 further includes a resistor $R_1$. The input source 201 is represented as a Thevenin equivalent circuit with an input voltage source $V_{IN}$ and the source resistance $R_S$. The input source 201 is applied across the input terminal 202 and the output 203 terminal of BA. It can be shown that for $\varepsilon \ll 1$, the voltage gain of the amplifier is approximated by $$a_v = \frac{v_o}{v_i} = \frac{R_1}{R_S + \varepsilon R_1} \approx \frac{R_1}{R_S}$$

The above equation indicates that the voltage gain is determined by the ratio of resistors, which can be controlled more precisely and vary less due to process, temperature, or power supply voltage variations than the value of $\varepsilon$ in the first embodiment.

Figure 5:
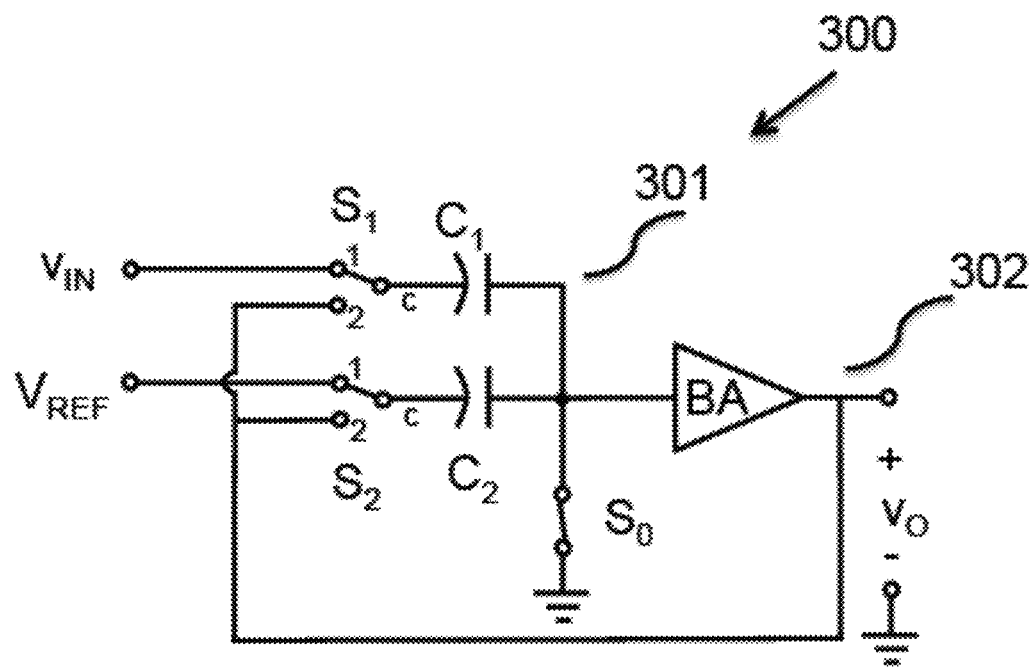
FIG. 5 illustrates a discrete-time amplifier circuit including a buffer amplifier and a plurality of capacitors, according to a third embodiment of the present invention.

A third embodiment of the present invention is shown in FIG. 5. The amplifier 300 performs discrete-time signal addition and amplification. In the circuit of FIG. 5 the switches S0, S1 and S2 are operable to operate the circuit in two phases, namely a "sampling phase" and an "amplification phase." For purposes of illustration, in FIG. 5 the switch S0 is shown as a single-pole single-throw (SPST) switch and switches S1 and S2 are shown as single-pole double-throw (SPDT) switches having a common terminal C and respective output terminals 1 and 2. During the sampling phase, the switches are operated to be in the state shown in FIG. 5, i.e., S0 closed and the common terminal C of each of S1 and S2 is electrically coupled to terminal 1 of the switch.

Figure 6:
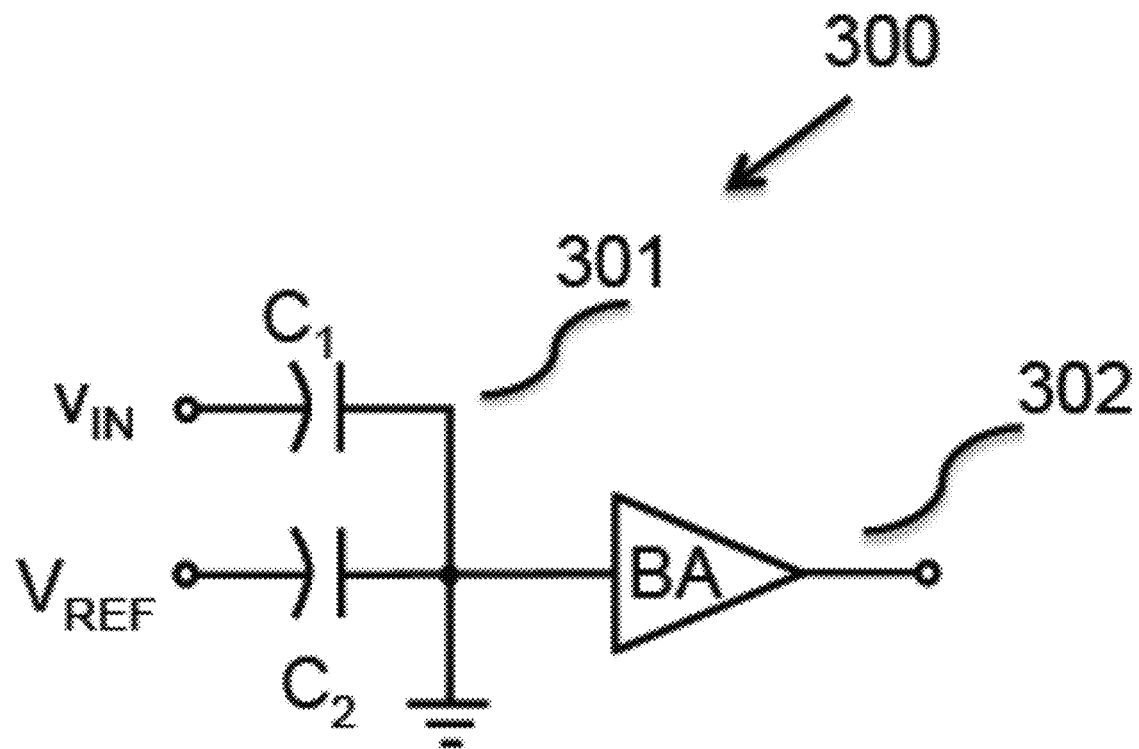
FIG. 6 illustrates the circuit of FIG. 5 redrawn without switches and showing the state of electrical connections during a sampling phase of circuit operation.

FIG. 6 illustrates the circuit of FIG. 5 redrawn without the switches S0, S1 and S2 and showing the state of electrical connections during the sampling phase. As shown in FIG. 6, the input voltage vIN is applied across the capacitor C1 and the reference voltage VREF is applied across the capacitor C2. Thus, the total charge Qtotal stored during the sampling phase on the capacitor plate 301 is given by −vIN C1−VREFC2. During the amplification phase, the switches are operated such that S0 is open, and the common terminal C of each of S1 and S2 is electrically coupled to terminal 2 of the switch.

Figure 7:
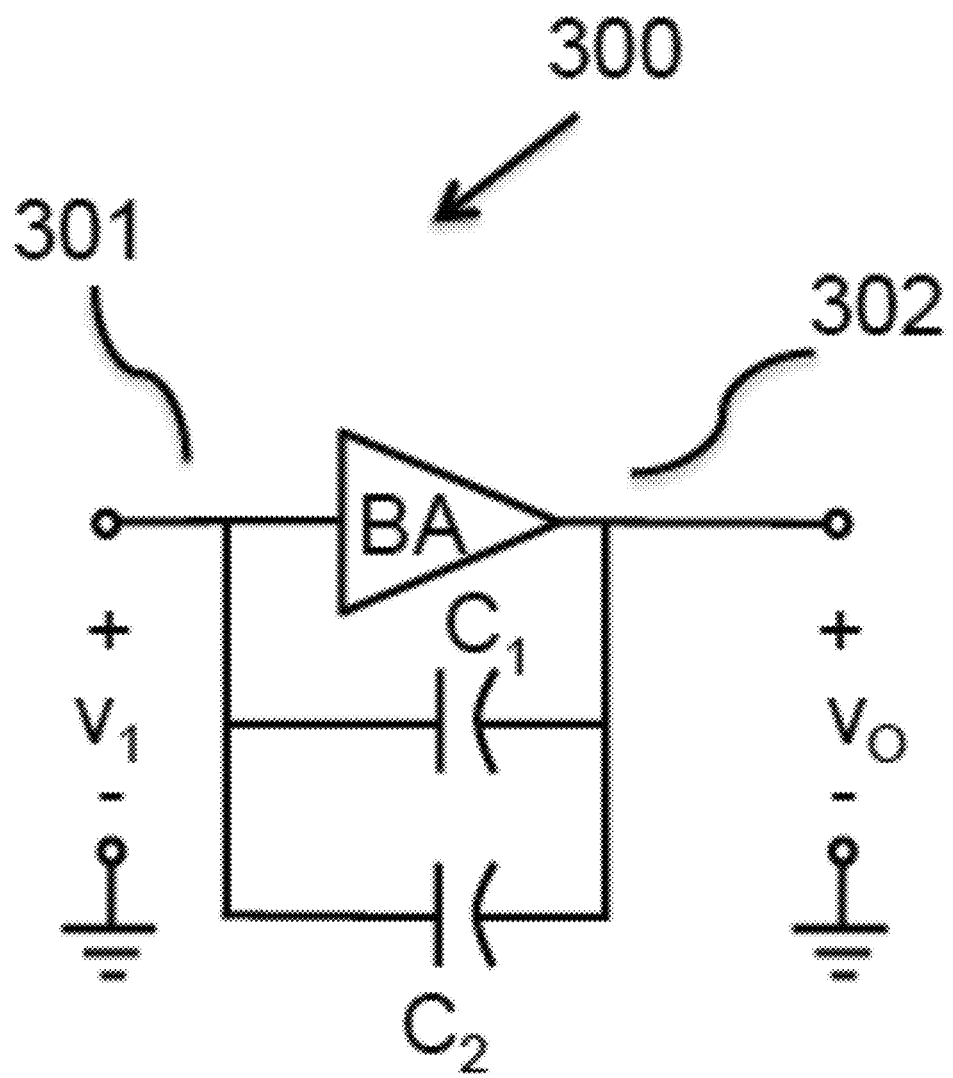
FIG. 7 illustrates the circuit of FIG. 5 redrawn without switches and showing the state of electrical connections during an amplification phase of circuit operation.

FIG. 7 illustrates the circuit of FIG. 5 redrawn without the switches S0, S1 and S2 and showing the state of electrical connections during the amplification phase. In the amplification phase, because charge is conserved on capacitor plate 301, $$Q_{amp} = (C_1 + C_2)(v_1 - v_O)$$
$$= Q_{total}$$
$$= -C_1 v_{IN} - C_2 V_{REF}$$

Solving for the output voltage $v_O$:

$$v_O = -\frac{1-\varepsilon}{\varepsilon} \frac{C_1 v_{IN} + C_2 V_{REF}}{C_1 + C_2} \approx -\frac{1}{\varepsilon} \frac{C_1 v_{IN} + C_2 V_{REF}}{C_1 + C_2}$$

which is amplification of the weighted sum of two voltages, $v_{IN}$ and $V_{REF}$ with a voltage gain of $-1/\varepsilon$. The weighting between the two voltages is given by the ratio of the two capacitors $C_1$ and $C_2$. Such an operation is useful, for example, in an A/D converter.

For some applications, it may be more convenient to use the input voltage of the buffer $v_1$ as the output voltage. In this case, the output voltage is also given by $$v_1 = -\frac{1}{\varepsilon} \frac{C_1 v_{IN} + C_2 V_{REF}}{C_1 + C_2}$$

Figure 8:
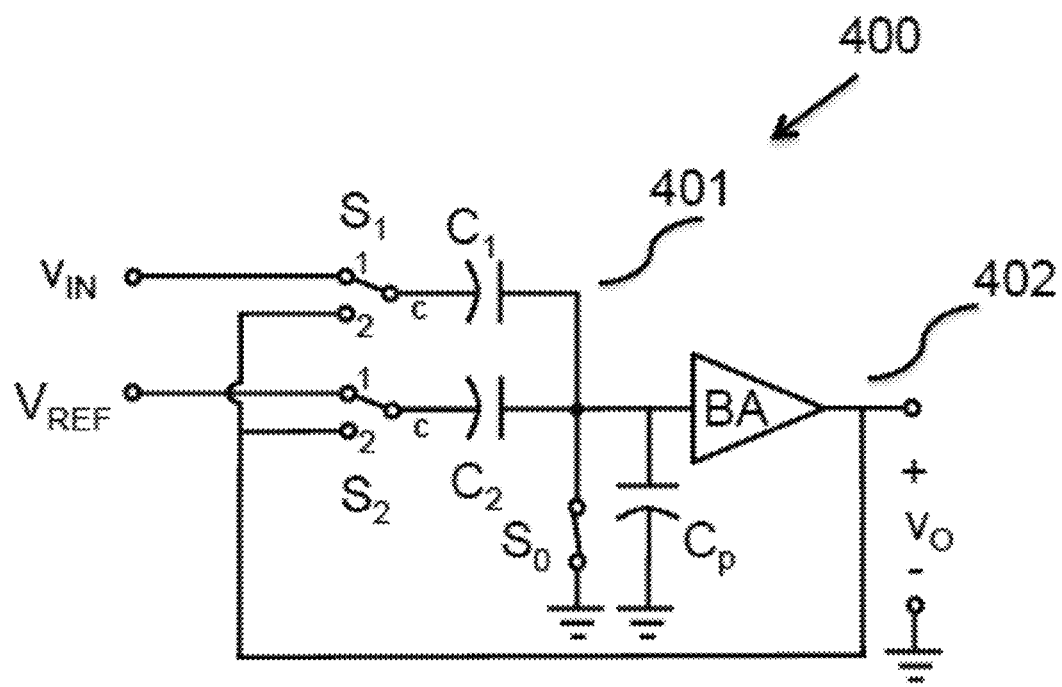
FIG. 8 illustrates a discrete-time amplifier circuit including a buffer amplifier and plurality of capacitors, according to a fourth embodiment of the present invention.

A fourth embodiment of the present invention is illustrated in FIG. 8, where the amplifier circuit 400 includes a third capacitor $C_p$, which may be parasitic capacitance or an intentional capacitance. As would be readily appreciated by one of skill in the art, in the circuit of FIG. 8 the switches $S_0$, $S_1$ and $S_2$ are operable to operate the circuit in two phases, namely a "sampling phase" and an "amplification phase." For purposes of illustration, in FIG. 8 the switch $S_0$ is shown as a single-pole single-throw (SPST) switch and switches $S_1$ and $S_2$ are shown as single-pole double-throw (SPDT) switches having a common terminal C and respective output terminals 1 and 2. During the sampling phase, the switches are operated to be in the state shown in FIG. 8, i.e., $S_0$ closed and the common terminal C of each of $S_1$ and $S_2$ is electrically coupled to terminal 1 of the switch.

Figure 9:
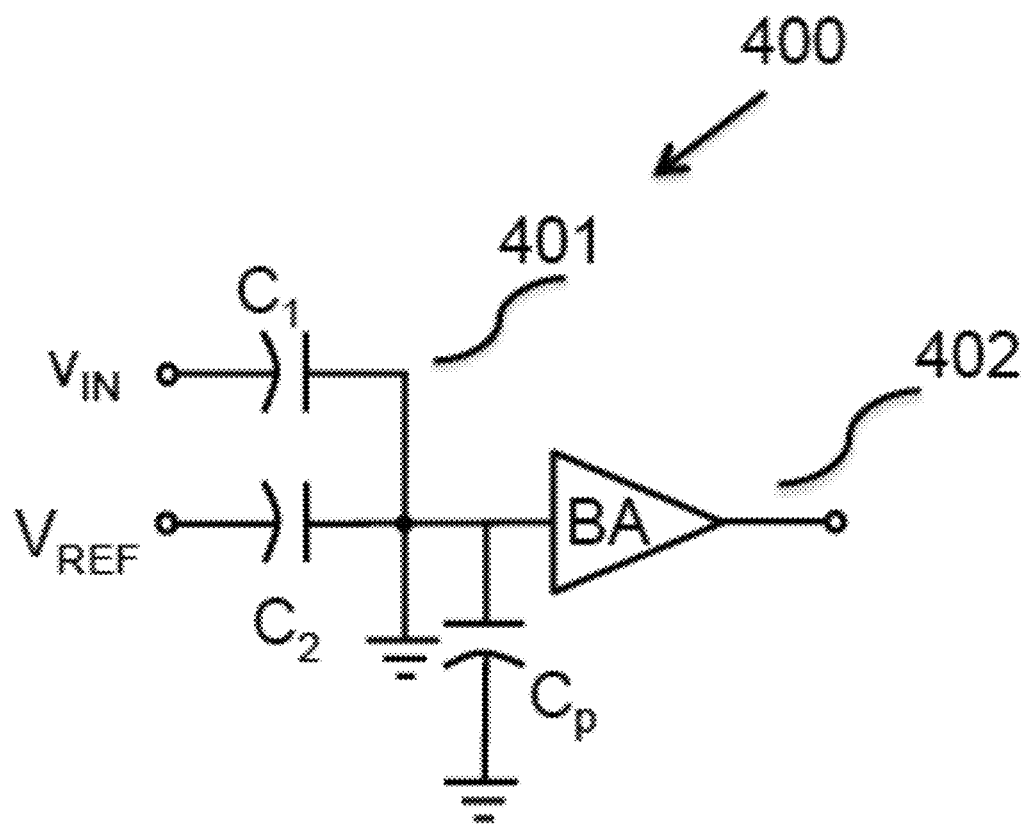
FIG. 9 illustrates the circuit of FIG. 8 redrawn without switches and showing the state of electrical connections during a sampling phase of circuit operation.

FIG. 9 illustrates the circuit of FIG. 8 redrawn without the switches $S_0$, $S_1$ and $S_2$ and showing the state of electrical connections during the sampling phase. As shown in FIG. 8, the input voltage $v_{IN}$ is applied across the capacitor $C_1$ and the reference voltage $V_{REF}$ is applied across the capacitor $C_2$. Thus, the total charge $Q_{total}$ stored during the sampling phase on the capacitor plate 401 is given by $-v_{IN} C_1 - V_{REF} C_2$. During the amplification phase, the switches are operated such that $S_0$ is open, and the common terminal C of each of $S_1$ and $S_2$ is electrically coupled to terminal 2 of the switch.

Figure 10:
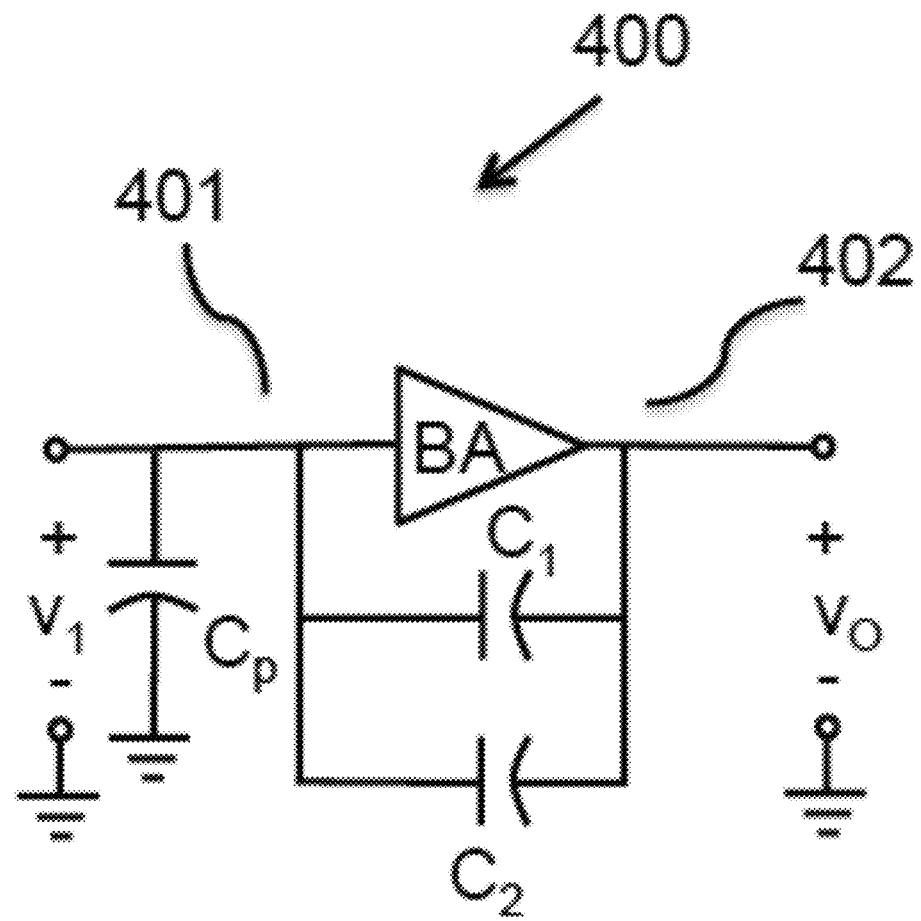
FIG. 10 illustrates the circuit of FIG. 8 redrawn without switches and showing the state of electrical connections during an amplification phase of circuit operation.

FIG. 10 illustrates the circuit of FIG. 8 redrawn without the switches $S_0$, $S_1$ and $S_2$ and showing the state of electrical connections during the amplification phase. In the amplification phase, because charge is conserved, $$Q_{amp} = (C_1 + C_2)(v_1 - v_O) + C_P v_1$$

$$= Q_{total}$$

$$= -C_1 v_{IN} - C_2 V_{REF}$$

Assuming the gain of the buffer is very close to 1, i.e. $\epsilon \ll 1$, and solving for the output voltage $v_O$ $$v_O = -\frac{C_1 + C_2}{C_P} \frac{C_1 v_{IN} + C_2 V_{REF}}{C_1 + C_2}$$

which is amplification of the weighted sum of two voltages, $V_{IN}$ and $V_{REF}$ with a voltage gain of $$a_v = -\frac{C_1 + C_2}{C_P}$$

Using the voltage $v_1$ at the input terminal of BA as the output yields substantially the same output voltage, and may be preferred in some applications.

Figure 11:
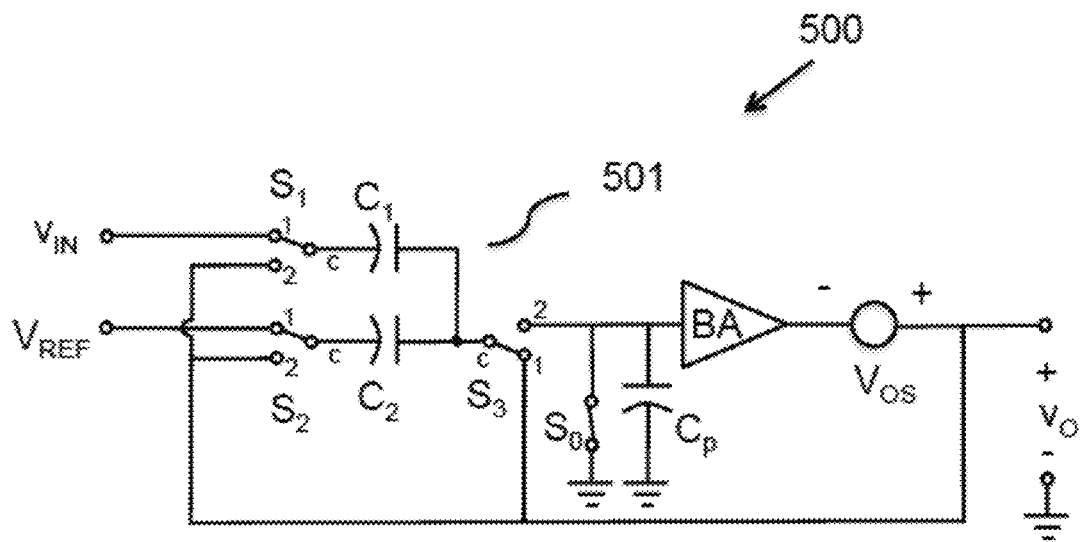
FIG. 11 illustrates a discrete-time amplifier circuit including a buffer amplifier with an undesirable offset voltage and plurality of capacitors, according to a fifth embodiment of the present invention.

Buffers can exhibit an undesirable offset voltage. In other words, the output voltage is shifted by an offset voltage $V_{OS}$ from an ideal output voltage. Such an offset voltage is amplified by the amplifier circuit and produce an error at the output. In a fifth embodiment of the present invention shown in FIG. 11, the effect of an undesirable offset voltage $V_{OS}$, modeled as a voltage source in series of BA, is removed. The second capacitor $C_2$ may be parasitic capacitance or an intentional capacitance. In the circuit of FIG. 11 the switches $S_0$, $S_1$, $S_2$ and $S_3$ are operable to operate the circuit in two phases, namely a "sampling phase" and an "amplification phase." For purposes of illustration, in FIG. 11 the switch $S_0$ is shown as a single-pole single-throw (SPST) switch and switches $S_1$, $S_2$ and $S_3$ are shown as single-pole double-throw (SPDT) switches having a common terminal C and respective output terminals 1 and 2. During the sampling phase, the switches are operated to be in the state shown in FIG. 11, i.e., $S_0$ closed and the common terminal C of each of $S_1$, $S_2$ and $S_3$ is electrically coupled to terminal 1 of the switch.

Figure 12:
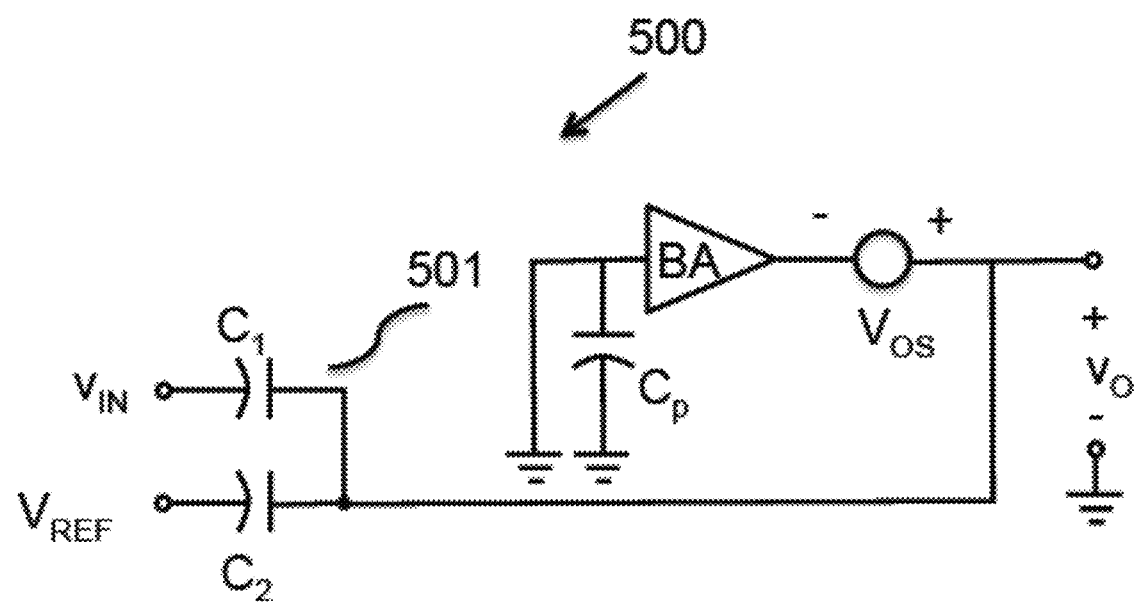
FIG. 12 illustrates the circuit of FIG. 11 redrawn without switches and showing the state of electrical connections during a sampling phase of circuit operation.
Figure 13:
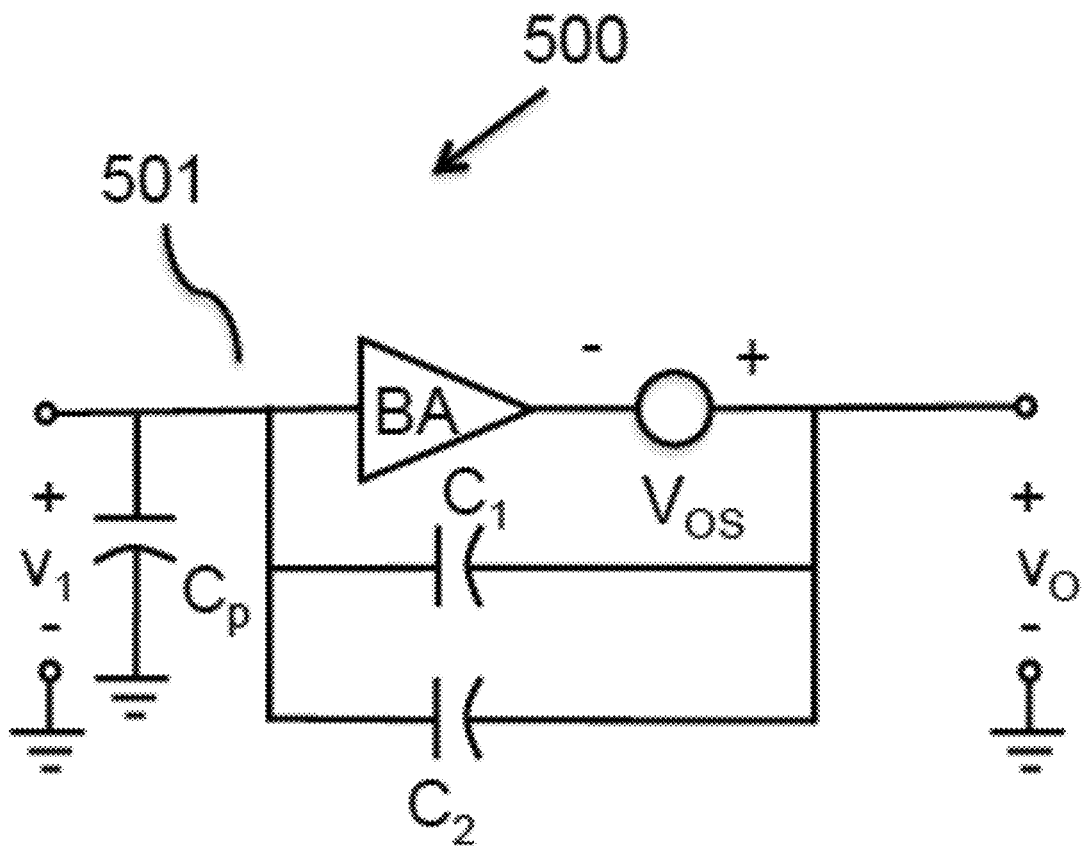
FIG. 13 illustrates the circuit of FIG. 11 redrawn without switches and showing the state of electrical connections during an amplification phase of circuit operation.

FIG. 12 illustrates the circuit of FIG. 11 redrawn without the switches $S_0$, $S_1$ and $S_2$ and showing the state of electrical connections during the sampling phase. As shown in FIG. 11, the input voltage $v_{IN}$ is applied across the capacitor $C_1$ and the reference voltage $V_{REF}$ is applied across the capacitor $C_2$. Thus, the total charge $Q_{total}$ stored during the sampling phase on the capacitor plate 401 is given by $-v_{IN} C_1 - V_{REF} C_2$. During the amplification phase, the switches are operated such that $S_o$ is open, and the common terminal C of each of $S_1$, $S_2$ and $S_3$ is electrically coupled to terminal 2 of the switch. FIG. 13 illustrates the circuit of FIG. 11 redrawn without the switches $S_0$, $S_1$, $S_2$ and $S_3$ and showing the state of electrical connections during the amplification phase. Assuming the gain of the buffer is very close to 1, i.e. $\epsilon \ll 1$, and using $v_1$ as the output, it can be shown that $$v_1 = -\frac{C_1 + C_2}{C_P} \frac{C_1 v_{IN} + C_2 V_{REF}}{C_1 + C_2}$$

which shows that the effect of the BA offset voltage $V_{OS}$ is removed.

Figure 14:
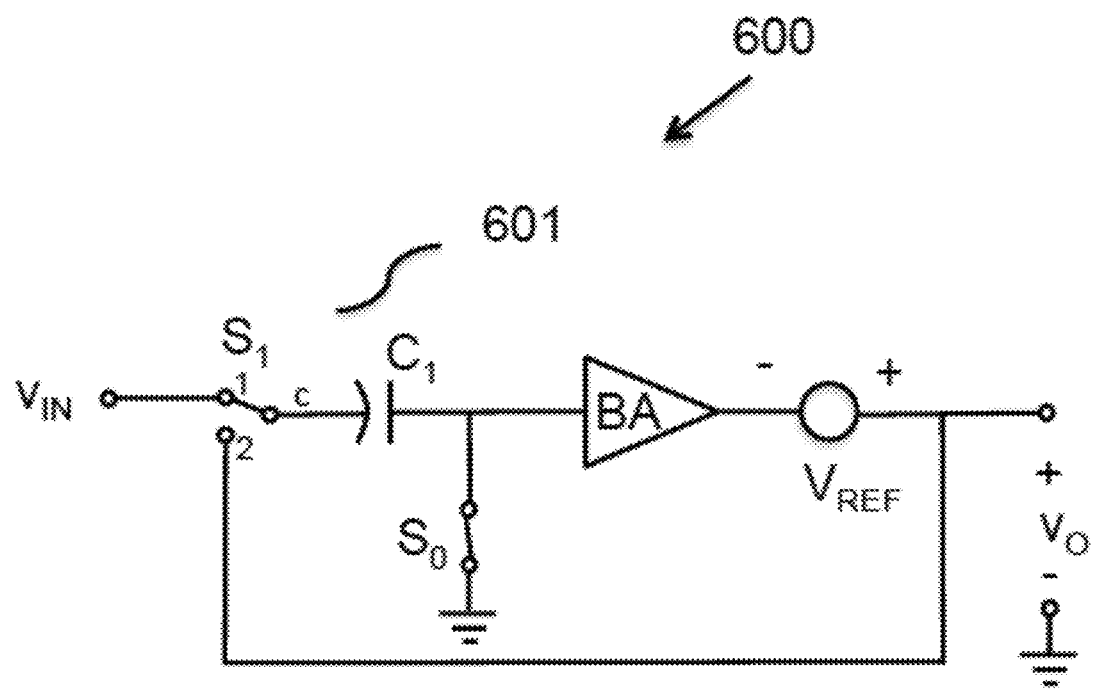
FIG. 14 illustrates a discrete-time amplifier circuit including a buffer amplifier with an intentional offset voltage and a capacitor, according to a sixth embodiment of the present invention.

In a sixth embodiment of the present invention, shown in FIG. 14, an intentional offset voltage $V_{REF}$ provided in the BA, as represented by a voltage source $V_{REF}$ in series with the output of the BA. The offset can be introduced by a variety of methods, for example a base-to-emitter voltage $V_{BE}$ of an emitter follower, a gate-to-source voltage $V_{GS}$ of a source follower, or a capacitive level shifting. The amplifier 600 performs discrete-time signal amplification. In the circuit of FIG. 14 the switches $S_0$ and $S_1$ are operable to operate the circuit in two phases, namely a "sampling phase" and an "amplification phase." For purposes of illustration, in FIG. 14 the switch $S_0$ is shown as a single-pole single-throw (SPST) switch and switch $S_2$ is shown as a single-pole double-throw (SPDT) switch having a common terminal C and respective output terminals 1 and 2. During the sampling phase, the switches are operated to be in the state shown in FIG. 14, i.e., $S_0$ closed and the common terminal C of $S_1$ is electrically coupled to terminal 1 of the switch.

Figure 15:
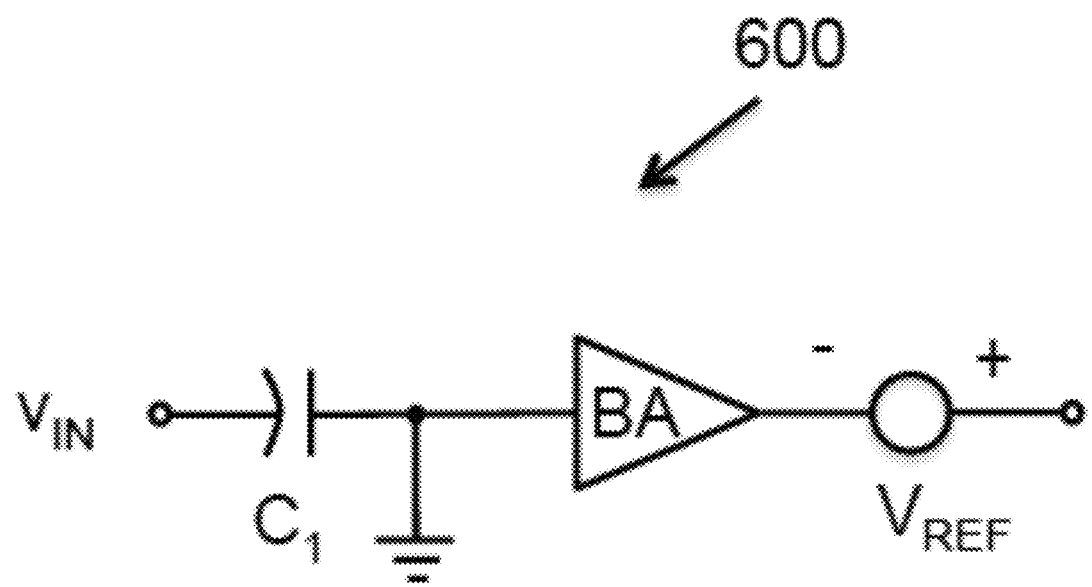
FIG. 15 illustrates the circuit of FIG. 14 redrawn without switches and showing the state of electrical connections during a sampling phase of circuit operation.
Figure 16:
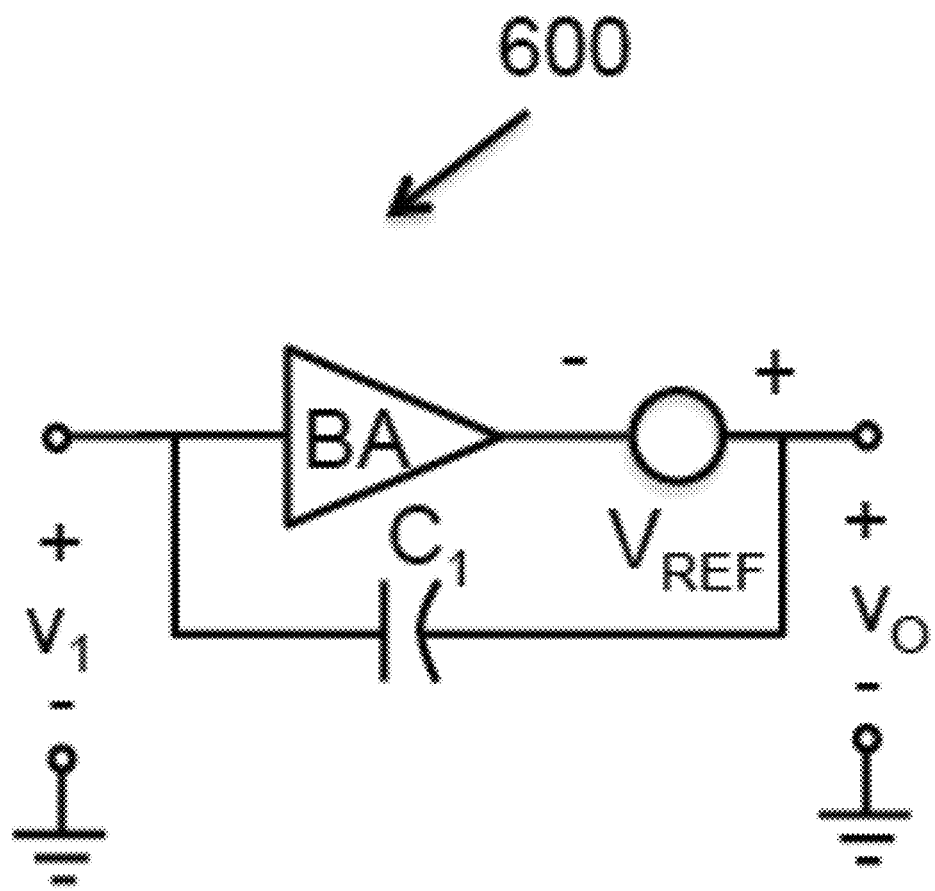
FIG. 16 illustrates the circuit of FIG. 14 redrawn without switches and showing the state of electrical connections during an amplification phase of circuit operation.

FIG. 15 illustrates the circuit of FIG. 14 redrawn without the switches $S_0$ and $S_1$ and showing the state of electrical connections during the sampling phase. As shown in FIG. 15, the input voltage $v_{IN}$ is applied across the capacitor $C_1$. During the amplification phase, the switches are operated such that $S_0$ is open, and the common terminal C of $S_1$ is electrically coupled to terminal 2 of the switch. FIG. 16 illustrates the circuit of FIG. 14 redrawn without the switches $S_0$ and $S_1$ and showing the state of electrical connections during the amplification phase.

It can be shown that the voltage at the output of the BA in the amplification phase is given by $$v_0 = -\frac{1-\varepsilon}{\varepsilon}(v_{IN} - V_{REF}) + V_{REF}$$

$$\approx -\frac{1}{\varepsilon}(v_{IN} - V_{REF}) + V_{REF}$$

In some applications, it may be desirable to use the input voltage $v_1$ as the output voltage. In this case, the output voltage is given by $$v_1 = -\frac{1-\varepsilon}{\varepsilon}(v_{IN} - V_{REF})$$

$$\approx -\frac{1}{\varepsilon}(v_{IN} - V_{REF})$$

Thus, the amplifier amplifies the difference between the input voltage and the offset voltage $V_{REF}$ by a voltage gain $-1/\epsilon$.

Figure 17:
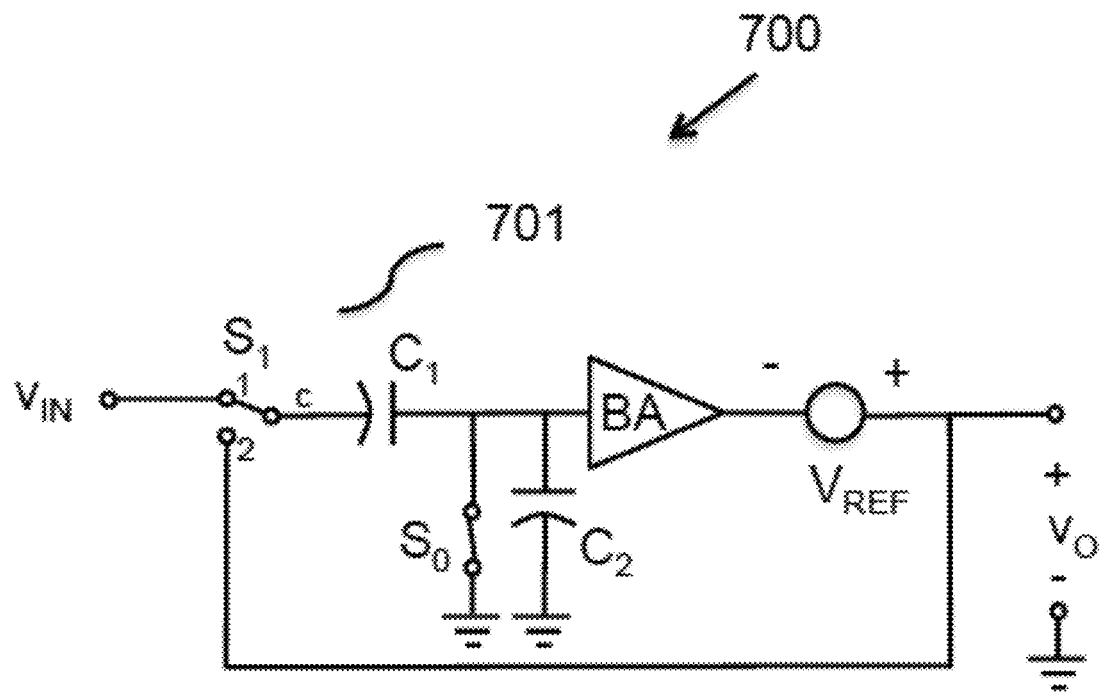
FIG. 17 illustrates a discrete-time amplifier circuit including a buffer amplifier with an intentional offset voltage and plurality of capacitors, according to a seventh embodiment of the present invention.

In a seventh embodiment of the present invention shown in FIG. 17, the buffer BA is provided with an intentional offset voltage $V_{REF}$, and a capacitor $C_2$ further included, which can be either intentional capacitance or parasitic capacitance. It can be shown that for $\epsilon \ll 1$, the output voltage in the amplification phase of the amplifier is given by $$v_{OUT} = -\frac{C_1}{C_2}(v_{IN} - V_{REF}) + V_{REF}$$

and if the input voltage $v_1$ of BA is used as the output $$v_1 = -\frac{C_1}{C_2}(v_{IN} - V_{REF})$$

Thus, the difference between the input voltage $v_{In}$ and the offset voltage $V_{REF}$ is amplified by a voltage gain $a_v$ determined by the ratio of capacitors $C_1$ and $C_2$;

$$a_v = -\frac{C_1}{C_2}$$

Figure 18:
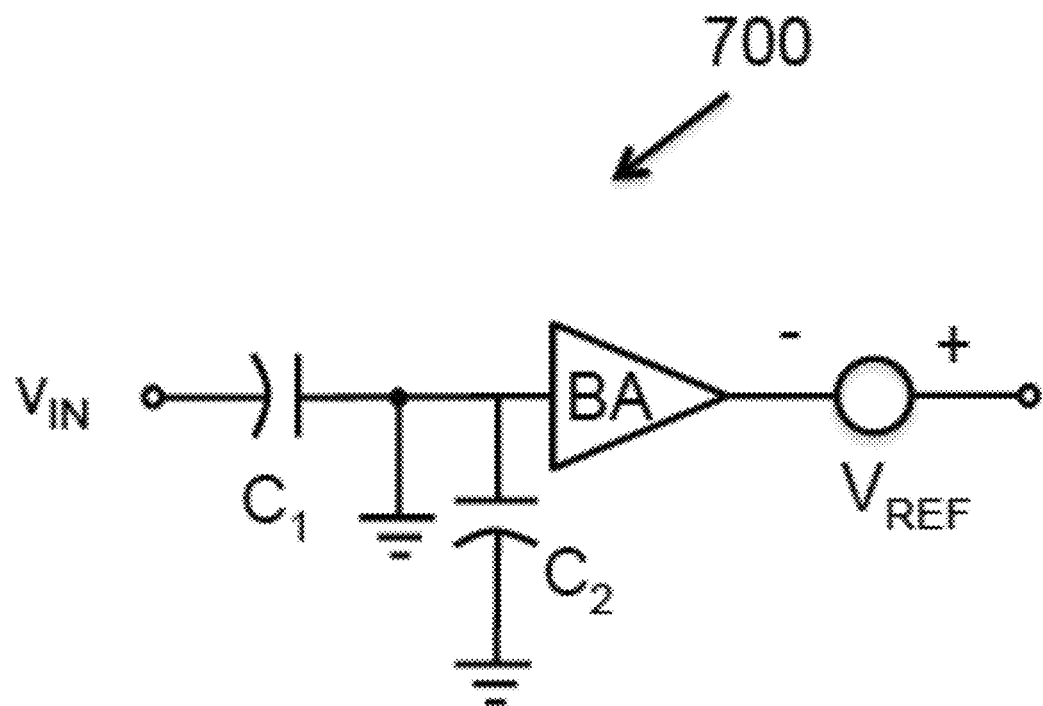
FIG. 18 illustrates the circuit of FIG. 17 redrawn without switches and showing the state of electrical connections during a sampling phase of circuit operation.

FIG. 18 illustrates the circuit of FIG. 17 redrawn without switches and showing the state of electrical connections during a sampling phase of circuit operation.

Figure 19:
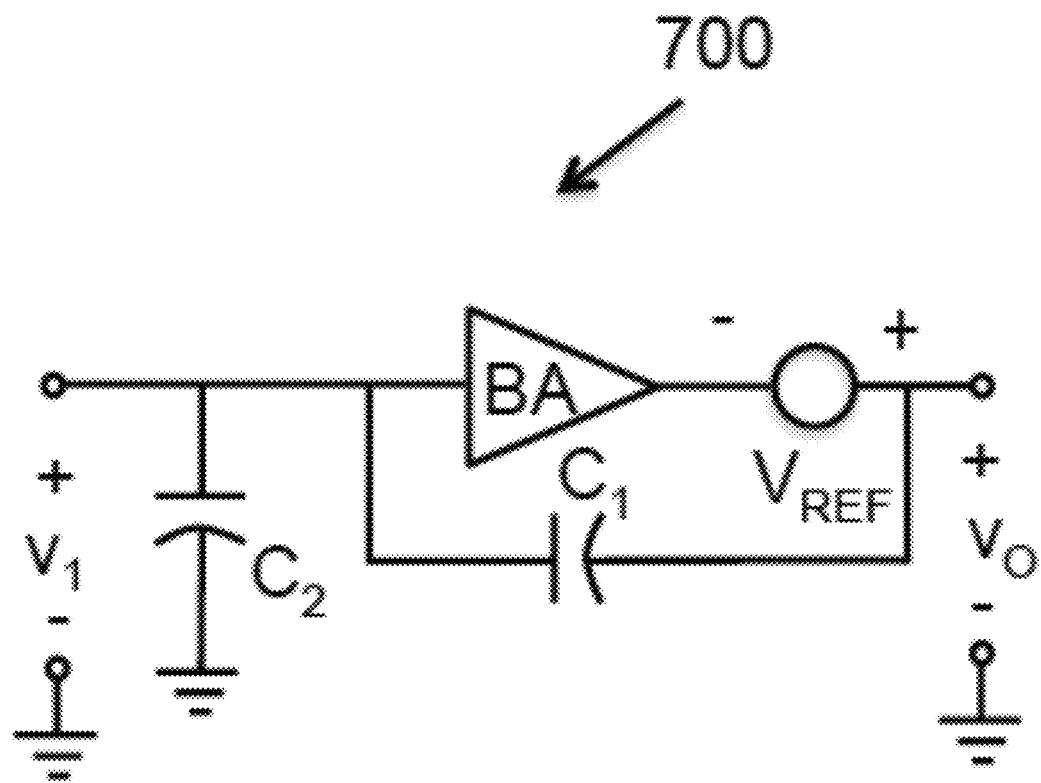
FIG. 19 illustrates the circuit of FIG. 17 redrawn without switches and showing the state of electrical connections during an amplification phase of circuit operation.

FIG. 19 illustrates the circuit of FIG. 17 redrawn without switches and showing the state of electrical connections during an amplification phase of circuit operation.

Figure 20:
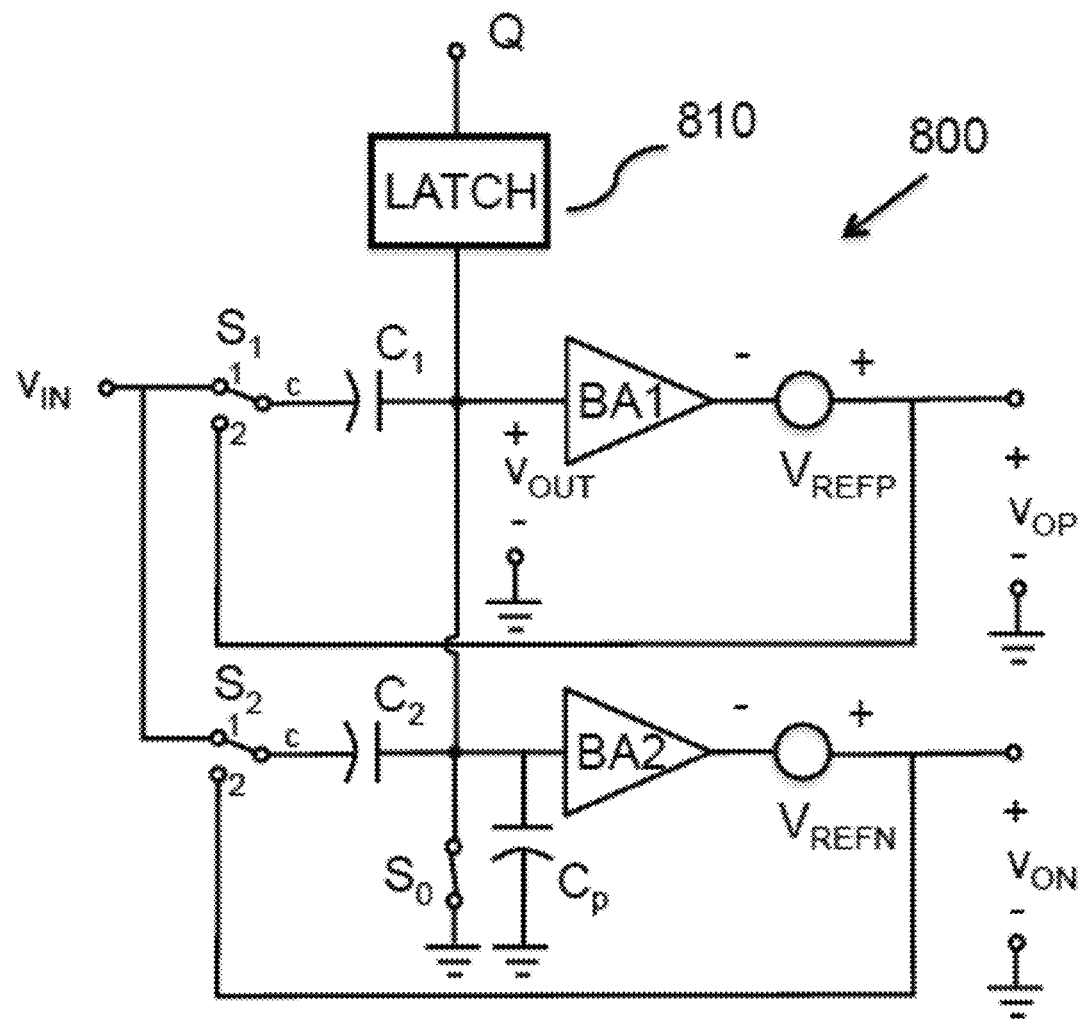
FIG. 20 illustrates a discrete-time amplifier circuit including a plurality of buffer amplifiers each with an intentional offset voltage and plurality of capacitors, according to an eighth embodiment of the present invention.

In an eighth embodiment of the present invention, shown in FIG. 20, the buffer based amplification circuit 800 is used as a preamplifier for a comparator with two reference voltages, $V_{REFN}$ and $V_{REFP}$. Such an arrangement can be used in flash analog-to-digital (A/D) converters and successive approximation register (SAR) A/D converters.

The comparator typically consists of a latch (LATCH) or a preamplifier followed by a latch. Due to the device variability, a latch typically has a large random offset voltage, and is not suitable for ADC resolutions over 3-4 bits. Comparators for higher resolution ADCs generally employ a preamplifier in order to reduce the offset voltage. A potential drawback of such implementations is significant power consumption of the preamplifier.

An eighth embodiment of the present invention shown in FIG. 20 provides preamplification. Two buffer amplifiers, BA1 and BA2, and two capacitors, C1 and C2 are employed for a comparator. A latch 810 receives the output $V_{OUT}$ of the preamplifier. BA1 and BA2 are buffers with appropriate offsets provided. For example, the offset $V_{REFP}$ of BA1 and $V_{REFN}$ of BA2, where $V_{REFP} - V_{REFN} = V_{REF}$.

Figure 21:
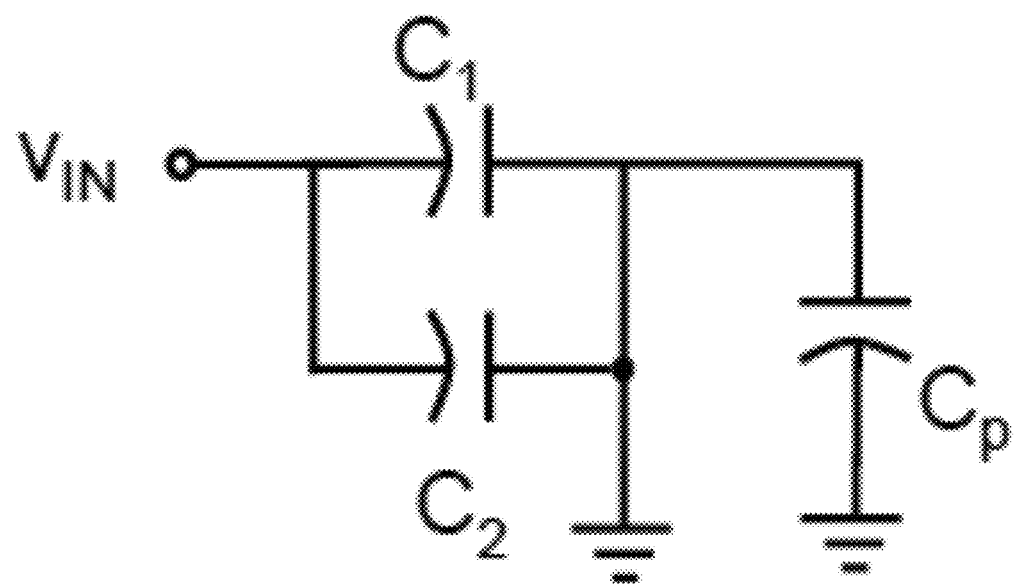
FIG. 21 illustrates the circuit of FIG. 20 redrawn without switches and showing the state of electrical connections during a sampling phase of circuit operation.
Figure 22:
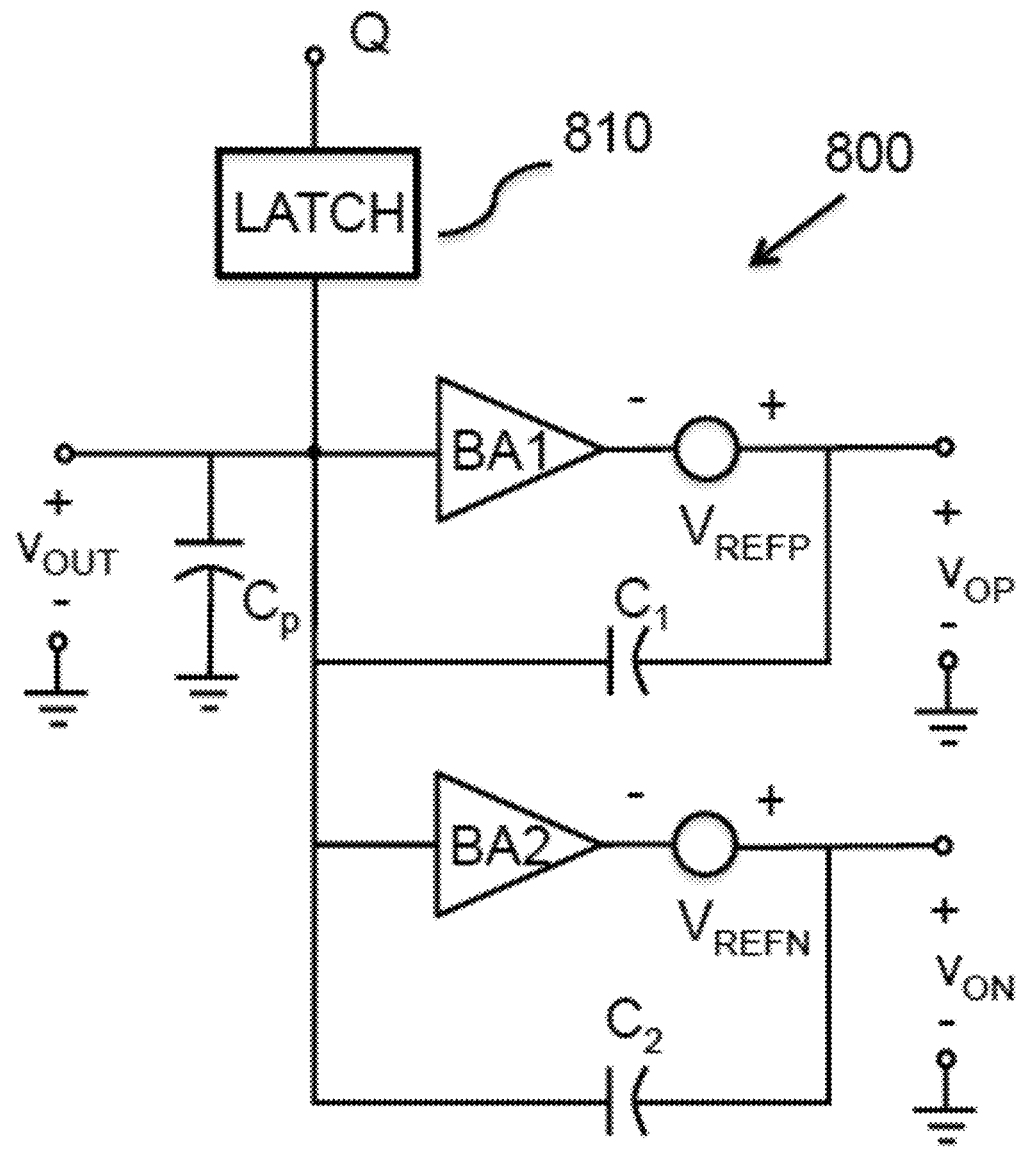
FIG. 22 illustrates the circuit of FIG. 20 redrawn without switches and showing the state of electrical connections during an amplification phase of circuit operation.

FIG. 21 illustrates the previous circuit without switches showing the state of electrical connections during the sampling phase. FIG. 22 illustrates the same circuit without the switches showing the state of electrical connections during the amplification phase. Assuming $\epsilon \ll 1$ for both BA1 and BA2, the output voltage $V_{OUT}$ in the amplification phase is $$V_{OUT} = -\frac{C_1 + C_2}{C_p}\left(V_{IN} - V_{REFN} - \frac{C_1}{C_1 + C_2}V_{REF}\right)$$

where $C_p$ is capacitance at the output node. The output voltage $V_{OUT}$ is the difference between the input voltage and $V_X$ amplified by a voltage gain $a_v$ where $$V_X = V_{REFN} + \frac{C_1}{C_1 + C_2}V_{REF}$$

$$a_v = -\frac{C_1 + C_2}{C_p}$$

This amplified difference is applied to the latch 810, and the digital output Q of the latch is then applied to a logic circuit.

Figure 23:
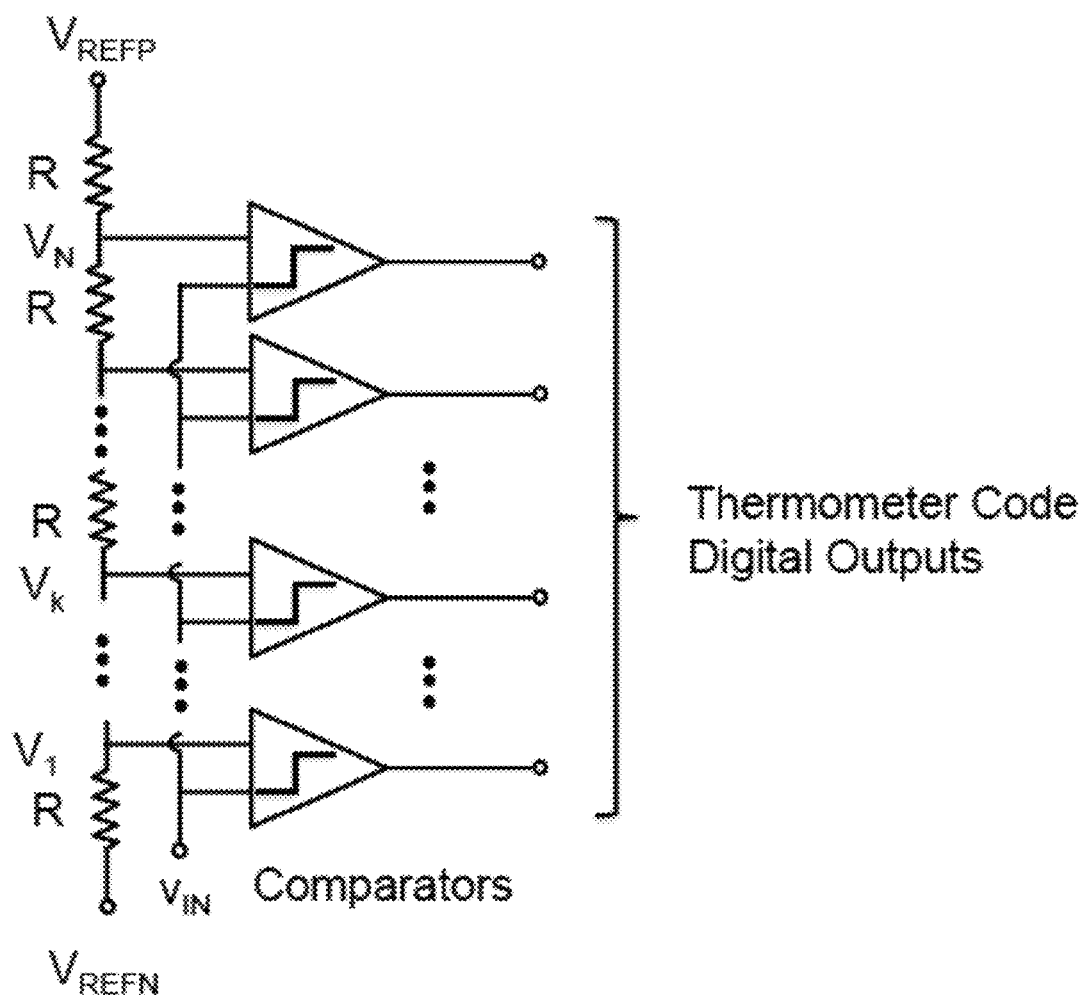
FIG. 23 illustrates a prior art flash A/D converter.

A prior art flash A/D converter is shown in FIG. 23, where a resistor ladder produces the tap voltages that are compared with the input voltage by a bank of N comparators. With the top of the ladder connected to one reference voltage $V_{REFP}$ and the bottom of the reference connected to another reference voltage $V_{REFN}$, the voltage at the k-th tap from the bottom is given by;

$$V_k = V_{REFN} + V_{REF}\frac{k}{N}$$

where $V_{REF} = V_{REFP} - V_{REFN}$ and N the number of resistors in the ladder. The input voltage is compared with the tap voltages by a bank of comparators.

The comparator typically consists of a latch or a preamplifier followed by a latch. Due to the device variability, a latch typically has a large random offset voltage, and is not suitable for ADC resolutions over 3-4 bits. Comparators for higher resolution ADCs generally employ a preamplifier in order to reduce the offset voltage. A drawback here is, again, the power consumption of the preamplifier. A preamplifier amplifies the difference between the input voltage $V_{IN}$ and the tap voltage $V_k$ by a voltage gain a, producing an output voltage;

$$V_{OUT} = a_v\left(V_{IN} - V_{REFN} - V_{REF}\frac{k}{N}\right)$$

where $a_v$ is the voltage gain of the preamplifier.

Figure 24:
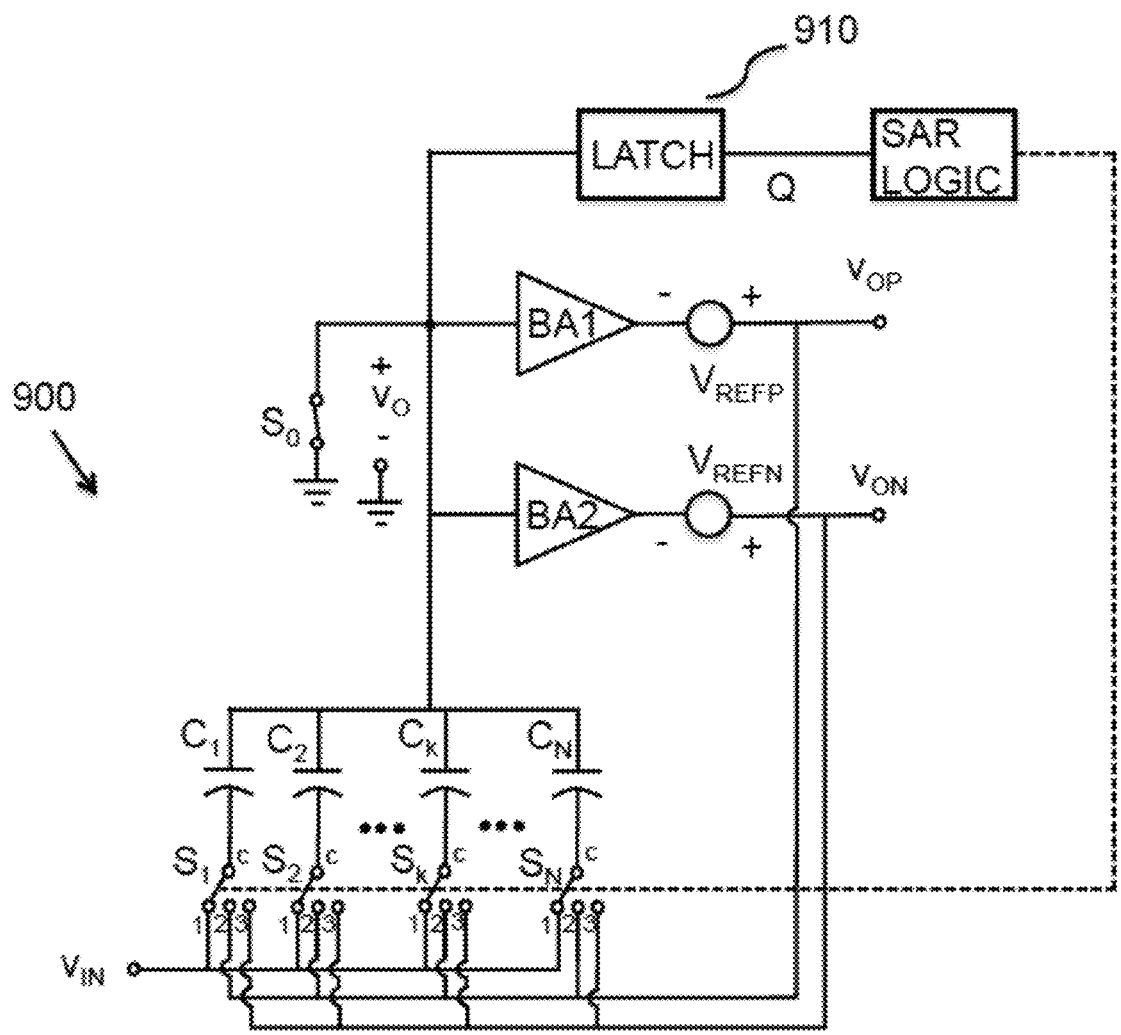
FIG. 24 illustrates a successive approximation register (SAR) A/D converter including a plurality of buffer amplifiers each with an intentional offset voltage and plurality of capacitors, according to a ninth embodiment of the present invention.

In a ninth embodiment, shown in FIG. 24, a SAR A/D converter 900 is provided two buffers, BA1 and BA2. A plurality of capacitors, $C_1$, $C_2$, through $C_N$, are appropriately ratioed for successive approximation. The buffer based amplification is used as a preamplifier for comparators in flash analog-to-digital (A/D) converter. In a flash A/D converter, an input voltage $V_{IN}$ is compared with N tap voltages simultaneously by N comparators.

The ninth embodiment of the present invention includes a voltage comparator preamplifier circuit 800 described in the eighth embodiment of the present invention for each voltage comparator in a flash A/D converter. Each comparator samples the input voltage during the sampling phase as described in the eighth embodiment. The output voltage $V_{OUT}$ of the circuit 800 in the amplification phase is $$V_{OUT} = -\frac{C_1 + C_2}{C_p}\left(V_{IN} - V_{REFN} - \frac{C_1}{C_1 + C_2}V_{REF}\right)$$

where $C_p$ is capacitance at the output node. Comparing this result with the preamplifier equations given previously, it is noted that they are equivalent, where $$a_v = -\frac{C_1 + C_2}{C_p}$$

$$\frac{k}{N} = \frac{C_1}{C_1 + C_2}$$

Thus, by choosing an appropriate ratio between $C_1$ and $C_2$, an effective tap voltage is created, and an output voltage that is equivalent to the output voltage of a prior art preamplifier is produced, without the use of the resistor ladder. The digital output Q of the latch is then applied to an encoding logic circuit.

Figure 25:
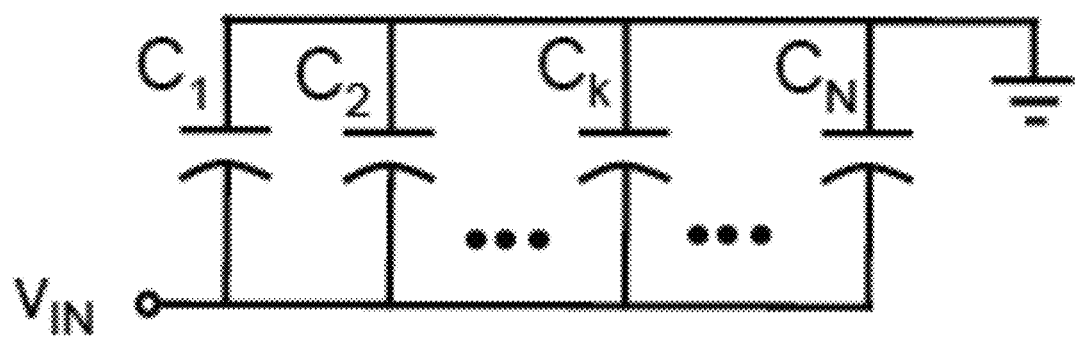
FIG. 25 illustrates the circuit of FIG. 24 redrawn without switches and showing the state of electrical connections during a sampling phase of circuit operation.
Figure 26:
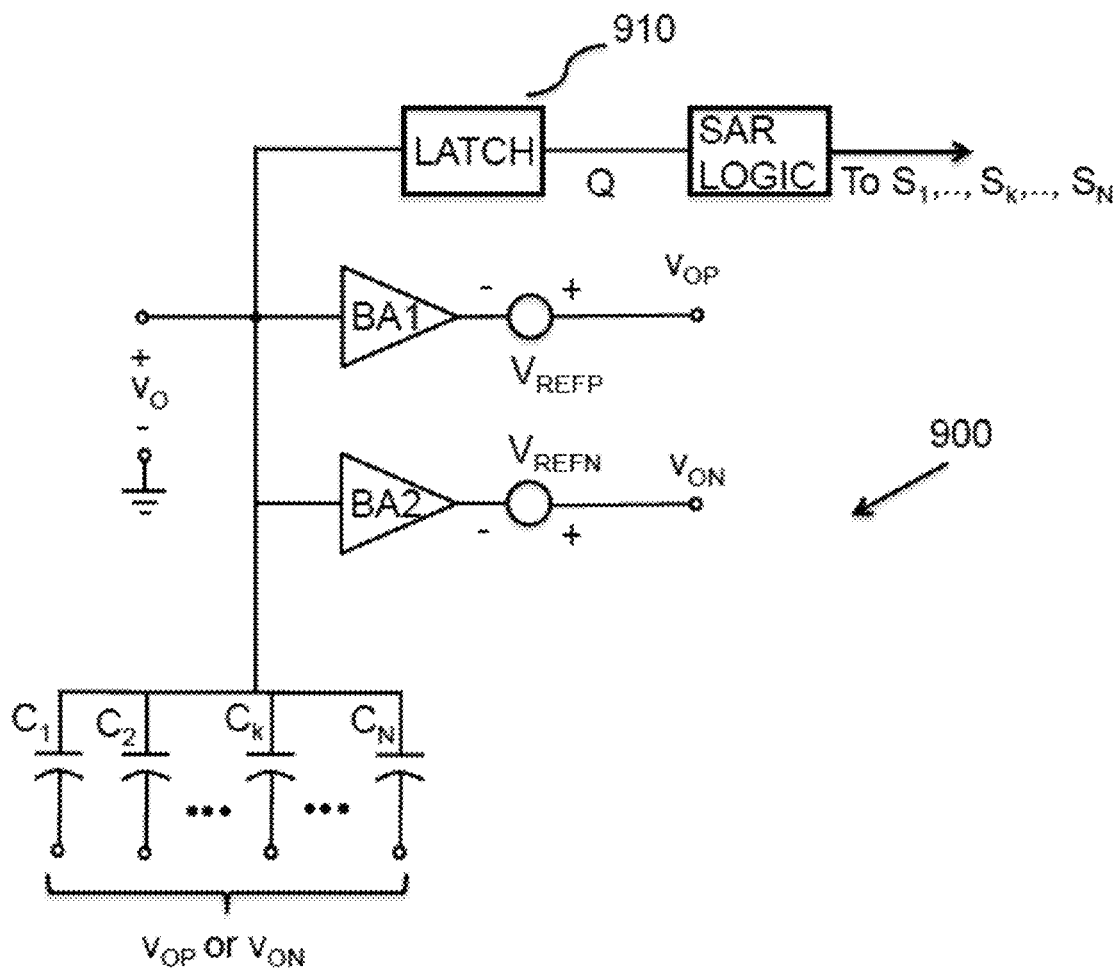
FIG. 26 illustrates the circuit of FIG. 24 redrawn without switches and showing the state of electrical connections during a successive approximation phase of circuit operation.

FIG. 25 shows A/D converter 900 without switches showing the state of electrical connections during the sampling phase. The input voltage $v_{IN}$ is sampled across $C_1$, $C_2$, through $C_N$ during the sampling phase of the operation. During the subsequent successive approximation phases, shown in FIG. 26 without the switches for simplicity, capacitors $C_1$, $C_2$, through $C_N$ are switched to the output of BA1 or BA2 according to the digital output Q of a latch 910 following a successive approximation algorithm. The output voltage $V_{OUT}$ is coupled to the latch 910 and the digital output Q of the latch is then applied to a SAR logic circuit, which controls the positions of the switches $S_1$, $S_2$, through $S_N$. More specifically, if the i-th digital output code of the latch 910 $D_i$ (i=1, 2, k, ... N) is 1, the switch $S_i$ is thrown to position 2 such that the corresponding capacitor $C_i$ is connected to the output voltage $v_{OP}$ of BA1, if the i-th digital code $D_i$ is 0, the switch $S_i$ is thrown to position 3 such that the corresponding capacitor $C_i$ is connected to the output voltage $v_{ON}$ of BA2. This operation produces an output voltage $$V_{OUT} = -a_v \left( V_{IN} - V_{REFN} - \sum_{i=1}^{N} \frac{D_i C_i}{C_{TOT}} V_{REF} \right)$$

where the voltage gain $a_v$ is $$a_v = -\frac{C_{TOT}}{C_p}$$

and the $C_{TOT}$ is the total capacitance and $D_i$ the i-th digital bit;

$$C_{TOT} = \sum_{i=1}^{N} C_i$$

It is shown that the output voltage is identical to that of a preamplifier output in a prior art successive approximation ADC with a voltage gain $a_v$. Since a reference buffer is generally required for each of the reference voltages in a prior art A/D converter, BA1 and BA2 may be created by slight modifications of these reference buffers. Therefore, an effective preamplification is achieved without a significant increase in complexity or power consumption.

Although the exemplary embodiments described in the previous herein have been illustrated in single-ended topologies, the extension to fully-differential topologies are straightforward. Also, a ground voltage is indicated in these embodiments for simplicity of explanation. The ground voltage can be replaced by a system common-mode voltage $V_{CM}$ in actual circuits without affecting the functionality of the embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A discrete-time amplifier circuit operable in a sampling phase and an amplification phase, the amplifier circuit comprising:
   a plurality of switches;
   a first and a second capacitor; and
   at least one buffer amplifier having an input terminal and an output terminal, wherein:
      during the sampling phase, the plurality of switches are configured to couple a first input voltage to the first capacitor and a second input voltage to the second capacitor; and
      during the amplification phase, the plurality of switches are configured to couple the first and the second capacitors across the input terminal and the output terminal of the buffer amplifier to amplify a weighted sum of the first and the second input voltages.

2. The circuit of claim 1, wherein an output voltage is obtained at the output terminal of the buffer amplifier.

3. The circuit of claim 1, further including a third capacitor electrically coupled to the input terminal of the buffer amplifier.

4. The circuit of claim 1, wherein the second input voltage is a reference voltage.

5. A discrete-time amplifier circuit operable in a sampling phase and an amplification phase, the amplifier circuit comprising:
   a plurality of switches;
   a first and a second capacitor; and
   at least one buffer amplifier having an input terminal, an output terminal, and an offset voltage, wherein:
      during the sampling phase, the plurality of switches are configured to couple a first input voltage and the output terminal of the buffer amplifier to the first capacitor and a second input voltage and the output terminal of the buffer amplifier to the second capacitor; and during the amplification phase, the plurality of switches are configured to couple the first and the second capacitors across the input terminal and the output terminal of the buffer amplifier to effectively remove the offset voltage of the buffer amplifier.

6. The circuit of claim 5, wherein an output voltage is obtained at the output terminal of the buffer amplifier.

7. The circuit of claim 5, further including a third capacitor electrically coupled to the input terminal of the buffer amplifier.

8. The circuit of claim 5, wherein the second input voltage is a reference voltage.

9. A discrete-time amplifier circuit operable in a sampling phase and an amplification phase, the amplifier circuit comprising:

a plurality of switches;

a capacitor; and a buffer amplifier having an input terminal and an output terminal, wherein:

the buffer amplifier includes an intentional offset voltage;

during the sampling phase, the plurality of switches are configured to couple an input voltage to the capacitor; and during the amplification phase, the plurality of switches are configured to couple the capacitor across the input terminal and the output terminal of the buffer amplifier to amplify a difference between the input voltage and the intentional offset voltage.

10. The circuit of claim 9, wherein an output voltage is obtained at the output terminal of the first buffer amplifier.

11. The circuit of claim 9, wherein the first intentional offset voltage is a reference voltage.

12. The circuit of claim 9, further including:

a second buffer amplifier and a second and a third capacitor; wherein:

the second capacitor receives the first input voltage during the sampling phase;

the second capacitor is coupled across the second buffer amplifier during the amplification phase; and the third capacitor is electrically coupled to the first buffer amplifier.

13. The circuit of claim 9, wherein the first intentional offset voltage is a reference voltage.

* * * * *